United States Patent [19]

Kiyose

[11] Patent Number: 4,991,059
[45] Date of Patent: Feb. 5, 1991

[54] ELECTRIC COMPONENT
[75] Inventor: Tomohito Kiyose, Kanagawa, Japan
[73] Assignee: Mitsubishi Denki K.K., Tokyo, Japan
[21] Appl. No.: 241,597
[22] Filed: Sep. 8, 1988
[30] Foreign Application Priority Data Sep. 22, 1987 [JP] Japan .................. 62-145070[U]

[51] Int. Cl.[5] ............................................. H01L 23/50
[52] U.S. Cl. ..................................... 361/405; 338/329
[58] Field of Search ............... 361/400, 403, 404, 405, 361/408; 338/329; 174/52.4, 259; 357/74, 80

[56] References Cited
U.S. PATENT DOCUMENTS 4,306,217 12/1981 Solow ................................. 338/329
4,661,887 4/1987 Lin ...................................... 361/405

FOREIGN PATENT DOCUMENTS 62120351 7/1978 Japan .
58060969 4/1983 Japan .
58144853 9/1983 Japan .
59006865 1/1984 Japan .
59158336 10/1984 Japan .
0199447 8/1988 Japan ..................................... 357/74

Primary Examiner—Gerald P. Tolin
Assistant Examiner—Paramita Ghosh
Attorney, Agent, or Firm—Kanesaka & Takeuchi

[57] ABSTRACT

An electronic component with leads each having a bonding portion is disclosed. Each bonding portion is formed with a through hole or a notch to provide for satisfactory soldering and reduce the possibility of defective soldering.

5 Claims, 3 Drawing Sheets

ELECTRIC COMPONENT

BACKGROUND OF THE INVENTION

1. Field of the Invention

This invention relates to an electric component such as an IC component mounted on a printed circuit board of surface-mounting system.

2. Description of the Prior Art

The surface-mounting system, unlike a conventional insertion system, in which leads of electric components are inserted through through holes formed in a printed circuit board, is one, in which leads of electric components are electrically connected by soldering them to a connection land pattern formed on a printed circuit board, and which has been extensively utilized with automatization of mounting of electric components.

FIGS. 8 and 9 are perspective views showing prior art IC components used in the surface-mounting system.

In the Figures, reference numeral 1 designates an IC package, from the opposite sides of which a plurality of leads 2 are led out toward a printed circuit board (not shown). Each lead 2 has an outwardly (FIG. 8) or inwardly (FIG. 9) horizontally bent end portion, which constitutes a bonding portion 2a to be soldered to a corresponding connection land 3 formed on a printed circuit board.

The IC component having the above construction is set on a printed circuit board with the bonding portions 2a of the leads 2 registered to lands 3 which have been printed using a cream solder, and it is then mounted on the printed circuit board with soldering of the bonding portions 2a to the lands 3 with the solder fused in a re-flow furnace utilizing infrared rays.

In the prior art electric component the bonding portion 2a is formed by merely bending the lead 2 as described before. However, the control of the solder film thickness at the time of the cream solder printing is considerably difficult, and if insufficient solder film thickness results from insufficient amount of solder, it frequently leads to defective or unsatisfactory soldering, i.e., failure of perfect connection between the solder and lead.

SUMMARY OF THE INVENTION

This invention has been intended in order to solve the above problems, and its object is to provide an electric component, with which defective soldering occurs difficultly even the thickness of the printed solder film is insufficient due to insufficient amount of solder used.

In the electric component according to the invention, a bonding portion of each lead is formed with a through hole or a notch extending at least up to the bent position of the lead.

The above and other objects, features and advantages of the invention will become more apparent from the following description when taken in conjunction with the accompanying drawings.

DESCRIPTION OF THE PREFERRED EMBODIMENT

Figure 8:
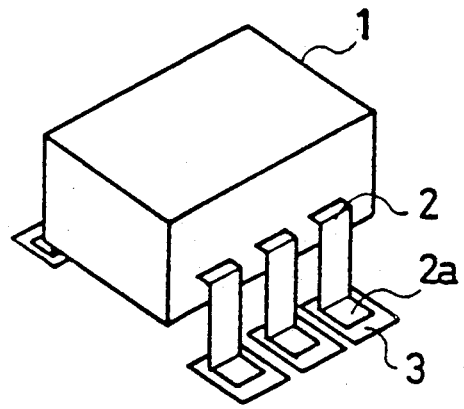
FIGS. 8 and 9 are perspective views showing prior art IC components.
Figure 9:
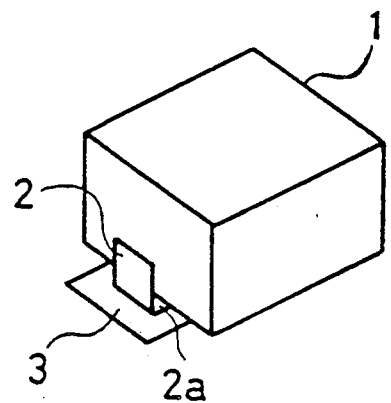

Now, an embodiment of the invention will now be described. Reference numerals like those in the prior art examples of FIGS. 8 and 9 designate like or corresponding parts, and detailed description of these parts will be omitted.

Figure 1:
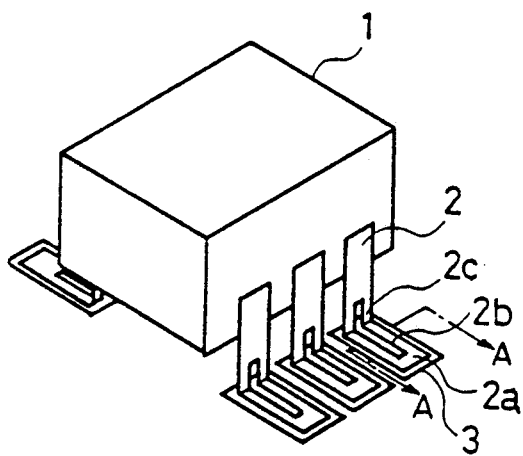
FIG. 1 a perspective view showing an embodiment of the I according to the invention.
Figure 2:
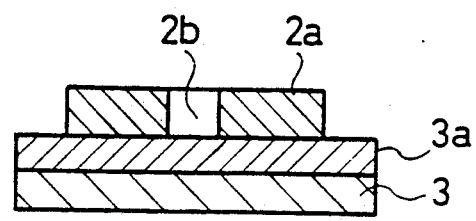
FIG. 2 is a sectional taken along line A—A in FIG. 1.
Figure 3:
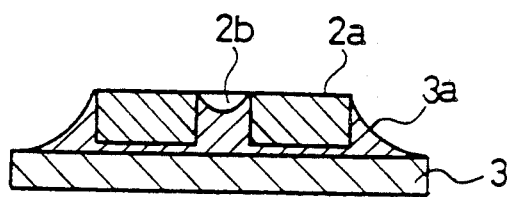

FIG. 1 is a perspective view showing an embodiment of the IC component, and FIG. 2 is a sectional view taken along line A—A in FIG. 1. In these Figures, reference numeral 2b designates a through hole formed in a bonding portion 2a of each lead 2. The through hole 2b is formed before bending the lead 2, and it has a length sufficient to reach a bent position 2c from a position adjacent to the free end of the bonding portion 2a. Reference numeral 3a designates a film of cream solder printed on a connection land 3 of a printed circuit board.

Figure 4:
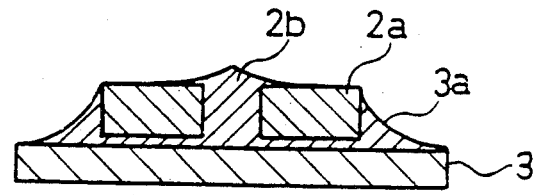
FIG. 4 are sectional views taken along line A—A in FIG. 1 for explaining the function of the embodiment.

Now, the function will be described. When the solder 3a is fused by heating in a re-flow furnace, the fused solder is pushed out by the weight of the IC component to be attached to the side surfaces of the through hole 2b as well as the side surface of the bonding portion 2a. Further, as shown in FIG. 4 the fused solder fills the through hole 2b and projects from the top of the bonding portion 2a. Thus, soldering can be obtained very satisfactorily, and defective soldering occurs difficultly. It is thus possible to obtain highly reliable solder bonding.

Figure 5:
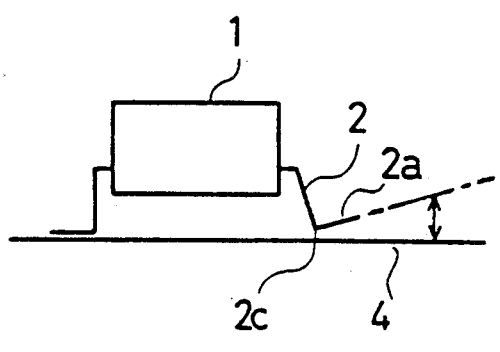
FIG. 5 is a side view showing an IC component having bent leads.

In an electric component of this kind, sometimes a lead 2 is outwardly bent from its stem as shown in FIG. 5. In such a case, a tilt is produced between the bonding portion 2a and printed circuit board 4. Therefore, only the bent position 2c of the bonding portion 2a is in contact with the land, so that very unsatisfactory soldering will result. In this embodiment, the through hole 2b is formed such that it extends up to the bent position 2c, so that the soldering can be considerably improved.

Figure 6:
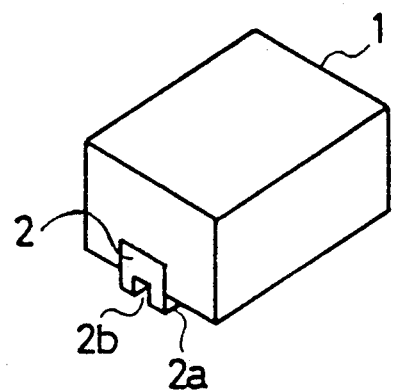
FIG. 6 and 7 are perspective views showing different embodiment invention.

In the above embodiment, the invention is applied to an electric component having outwardly bent bonding portions 2a. However, when the invention is applied to a j lead type with inwardly bent bonding portions, the same effects can be obtained by forming similar through holes 2b as shown in FIG. 6.

Figure 7:
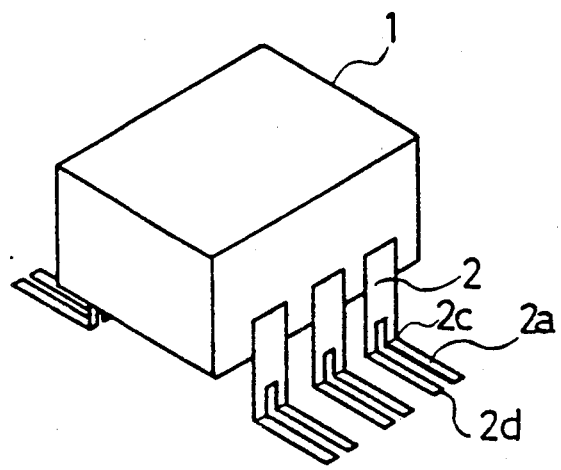

Further, while in the above embodiment the through hole 2b is formed in the bonding portion 2, it is possible to form a notch instead. FIG. 7 shows such an embodiment. In this instance, each lead 2 is formed with a notch 2d extending from the free end of the bonding portion 2a to a bent position 2c. Doing so permits a soldering improvement effect to be obtained in case when the leads 2 bent inwardly as well as the case of FIG. 5.

As has been described in the foregoing, according to the invention the bonding portion of each lead is formed with a through hole or a notch, so that it is possible to realize an electric component having a highly reliable bonding portion, with which defective soldering is less liable to occur compared to the prior art structure even if leads 2 are bent outwardly from their stem as shown in FIG. 5.

What is claimed is:

1. An electric component to be mounted on a surface of a printed circuit board, which comprises:
   a component body;
   at least a pair of leads extending outwardly downwardly and then laterally at a bent portions from opposite sides of said component body to form a lateral bonding portion; and
   means extending on said bonding portion up to and including at least said bent portion for receiving molten solder to provide more surfaces to which said molten solder is able to adhere, thus providing reliable soldering.

2. The electric component of claim 1, wherein said means extends from at least said bent portion to a point adjacent to a free end of said lead to form a hole.

3. The electric component of claim 1, wherein said means extends from at least said bent portion to a free end of said lead to form a notch.

4. The electric component of claim 1, wherein said lateral bonding portion extends outwardly.

5. The electric component of claim 1, wherein said lateral bonding portion extends inwardly.